United States Patent
Narayan et al.

(10) Patent No.: US 7,984,235 B2
(45) Date of Patent: *Jul. 19, 2011

(54) REDUCING CONTENT ADDRESSABLE MEMORY (CAM) POWER CONSUMPTION COUNTERS

(75) Inventors: Harsha Narayan, Sunnyvale, CA (US); Kenneth Huang, San Jose, CA (US); Ruturaj Pathak, Fremont, CA (US); Soren B. Pendersen, Petaluma, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/697,063

(22) Filed: Jan. 29, 2010

(65) Prior Publication Data

US 2010/0131703 A1    May 27, 2010

Related U.S. Application Data

(63) Continuation of application No. 11/850,074, filed on Sep. 5, 2007, now Pat. No. 7,680,978.

(51) Int. Cl.
*G06F 12/00* (2006.01)

(52) U.S. Cl. ......... 711/108; 711/165; 709/223; 709/225

(58) Field of Classification Search .................. 711/108, 711/156, 165, 170; 709/223, 225
See application file for complete search history.

(56) References Cited

U.S. PATENT DOCUMENTS

| | | | |
|---|---|---|---|
| 6,701,317 B1 * | 3/2004 | Wiener et al. .......................... 1/1 |
| 6,757,892 B1 * | 6/2004 | Gokhale et al. ............... 717/161 |
| 7,047,317 B1 * | 5/2006 | Huie et al. .................... 709/245 |
| 7,257,678 B2 | 8/2007 | Golden et al. |
| 7,653,623 B2 * | 1/2010 | Kashima et al. .............. 707/715 |
| 2002/0059201 A1 * | 5/2002 | Work ................................ 707/3 |
| 2004/0015672 A1 * | 1/2004 | Masse .......................... 711/173 |
| 2005/0114593 A1 * | 5/2005 | Cassell et al. ................. 711/114 |
| 2006/0080498 A1 | 4/2006 | Shoham et al. |
| 2006/0143398 A1 * | 6/2006 | Rau ............................... 711/136 |
| 2006/0168328 A1 * | 7/2006 | Shimada et al. ............. 709/238 |
| 2007/0022246 A1 | 1/2007 | Regev et al. |
| 2007/0033275 A1 * | 2/2007 | Toivonen et al. ............. 709/224 |
| 2010/0057697 A1 * | 3/2010 | Golwalkar et al. ............... 707/4 |
| 2010/0332583 A1 * | 12/2010 | Szabo .......................... 709/202 |

OTHER PUBLICATIONS

Co-pending U.S. Appl. No. 11/850,074, filed Sep. 5, 2007; Harsha Narayan et al., entitled "Reducing Content Addressable Memory (CAM) Power Consumption Counters".

Taskin Kocak, et al. "A power-efficient TCAM architecture for network forwarding tables" *Journal of Systems Architecture*, vol. 52, Feb. 2, 2006, pp. 307-314.

Kai Zheng, et al., "An Ultra High Throughput and Power Efficient TCAM-Based IP Lookup Engine[i]", IEEE Infocom, Jul. 2004, 11 pages.

Francis Zane, et al. "CoolCAMs: Power-Efficient TCAMs for Forwarding Engines", Bell Laboratories, Lucent Technologies, {francis,girija,basu}@research.bell-labs.com, Mar. 30-Apr. 3, 2003, 11 pages.

Wenjia Fang, et al. "Inter-AS Traffic Patterns and Their Implications" Princeton University {wfang\llp}@cs.princeton.edu, Mar. 16, 1999, 20 pages.

Cypress Semiconductor Corporation, Document #: 38-02110 Rev. *B, "Ayama™ 10000A Network Search Engine", Feb. 1, 2006, pp. 1-145.

* cited by examiner

*Primary Examiner* — Jack A Lane
(74) *Attorney, Agent, or Firm* — Harrity & Harrity, LLP (57) ABSTRACT

A method may include counting the number of times each of a plurality of entries in a content addressable memory (CAM) matches one or more searches; grouping entries in the CAM into a first subset and a second subset based on the number of times each of the plurality of entries in the CAM matches one or more searches; and searching the first subset for a matching entry and, if no matching entry is found, searching the second subset for the matching entry.

20 Claims, 9 Drawing Sheets

ADDRESS TABLE 442

| NETWORK ADDR. 502 |
|---|
| 01:AB — A1 |
| 02:AB — A2 |
| 03:AB — B1 |
| 04:AB — B2 |
| 05:AB — B3 |
| 06:AB — B4 |
| 07:AB — B5 |
| 08:AB — B6 |
| 09:AB — B7 |
| 10:AB — B8 |

FIRST SUBSET: 01:AB, 02:AB
SECOND SUBSET: 03:AB–10:AB

FIG. 5A

COUNT TABLE 444

| CAM ADDR. 504 | COUNT 506 |
|---|---|
| A1 | 95 |
| A2 | 93 |
| B1 | 83 |
| B2 | 92 |
| B3 | 10 |
| B4 | 29 |
| B5 | 23 |
| B6 | 30 |
| B7 | 65 |
| B8 | 11 |

FIRST SUBSET: A1, A2
SECOND SUBSET: B1–B8

ADDRESS TABLE 442

NETWORK ADDR. 502

FIRST SUBSET:
- 01:AB — A1
- 02:AB — A2

SECOND SUBSET:
- 03:AB — B1
- 04:AB — B2
- 05:AB — B3
- 06:AB — B4
- 07:AB — B5
- 08:AB — B6
- 09:AB — B7
- 10:AB — B8

FIG. 7B

COUNT TABLE 444'

| CAM ADDR. 504 | COUNT 506 |
|---|---|
| A1 | 95 |
| A2 | 93 |
| B1 | 83 |
| B2 | (94) |
| B3 | 10 |
| B4 | 29 |
| B5 | 23 |
| B6 | 30 |
| B7 | 65 |
| B8 | 11 |

FIRST SUBSET: A1, A2
SECOND SUBSET: B1–B8

ADDRESS TABLE 442'

NETWORK ADDR. 502

FIRST SUBSET:
- 01:AB — A1
- 04:AB — A2

SECOND SUBSET:
- 03:AB — B1
- 02:AB — B2
- 05:AB — B3
- 06:AB — B4
- 07:AB — B5
- 08:AB — B6
- 09:AB — B7
- 10:AB — B8

FIG. 9B

COUNT TABLE 444"

| CAM ADDR. 504 | COUNT 506 |
|---|---|
| A1 | 95 |
| A2 | 94 |
| B1 | 83 |
| B2 | 93 |
| B3 | 10 |
| B4 | 29 |
| B5 | 23 |
| B6 | 30 |
| B7 | 65 |
| B8 | 11 |

FIRST SUBSET: A1, A2
SECOND SUBSET: B1–B8

REDUCING CONTENT ADDRESSABLE MEMORY (CAM) POWER CONSUMPTION COUNTERS

RELATED APPLICATION

This application is a continuation of U.S. patent application Ser. No. 11/850,074, filed Sep. 5, 2007, which is incorporated herein by reference.

BACKGROUND

A content addressable memory (CAM) may be designed so that it searches its entire memory to see if the supplied data is stored anywhere in it. If the data is found, the CAM may return the memory address where the data was found. Applications requiring high-speed searching may employ CAMs to store the data to be searched. For example, a firewall application may search a CAM to determine if a data packet (identified by source address, destination address, source port, and/or destination port, for example) should be forwarded or dropped. A billing application may search a CAM to increment a traffic counter to so that a user may be billed according to bandwidth use.

SUMMARY

According to one aspect, a method may include counting the number of times each of a group of entries in a CAM matches one or more searches; grouping entries in the CAM into a first subset and a second subset based on the number of times each of the group of entries in the CAM matches one or more searches; and searching the first subset for a matching entry and, if no matching entry is found, searching the second subset for the matching entry.

According to another aspect, a network device may include a memory for storing groups of network addresses, where a first group includes network addresses determined more likely to be searched than a second group of network addresses; an input/output unit to receive a data unit including one of a destination network address or source network address; and a processor to search the first group of network addresses for the one of the destination network address or the source network address and, if a match is not found, to search the second group of network addresses for the one of the destination network address or the source network address.

According to another aspect, a method may include grouping network addresses stored in a memory into groups based on a likelihood of receiving data units corresponding to each of the network addresses; receiving a data unit; extracting a network address from the received data unit; and searching one of the groups most likely to include the extracted network address for the extracted network addresses and, if a matching entry is not found, searching a next one of the groups for the extracted network address.

According to another aspect, an apparatus may include means for counting a number of times each of a group of entries in a CAM matches one or more searches; means for grouping entries in the CAM into a first subset and a second subset based on the number of times each of the group of entries in the CAM matches one or more searches; and means for searching the first subset for a matching entry and, if no matching entry is found, searching the second subset for the matching entry.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

The following detailed description refers to the accompanying drawings. The same reference numbers in different drawings may identify the same or similar elements. Also, the following detailed description does not limit the invention. Instead, the scope of the invention is defined by the appended claims and equivalents.

Although searching a CAM may be fast, it often requires a large amount of power, e.g., the amount of work done or energy transferred per unit of time. The amount of power required to search a CAM may be proportional to the number of entries in the CAM. It may be the case, however, that the same CAM entries are searched for time and time again. In one embodiment, CAM entries more likely to be searched may be grouped together. If an initial search of the group is successful, power may be saved because the entire CAM was not unnecessarily searched. If the search was not successful, the remaining CAM entries (or another group of entries) of the CAM may be searched. As a result, the average power consumed by the CAM over a period of time may be reduced. Counting how often some entries in the CAM are searched for may determine which entries are more likely to be searched and, subsequently, grouped together.

Exemplary Environment

Figure 1:
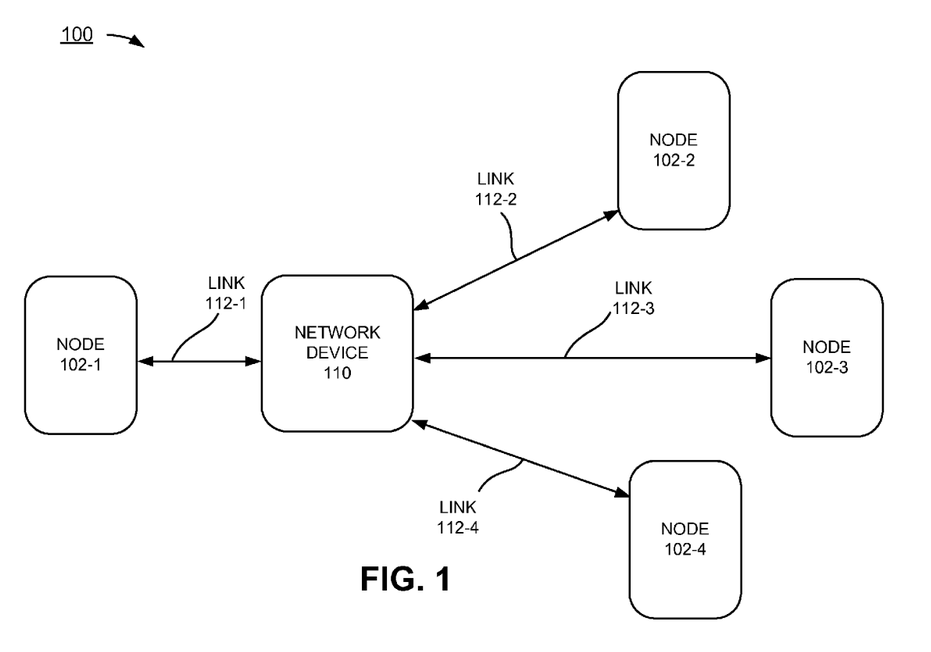
FIG. 1 is a block diagram of an exemplary environment in which embodiments may be implemented.

FIG. 1 is a block diagram of an exemplary environment 100 in which embodiments described herein may be implemented. Environment 100 may include nodes 102-1 through 102-4 (collectively "nodes 102," individually "node 102-x"), a network device 110 to receive and forward data, and links 112-1 through 112-4 (collectively "links 112," individually "link 112-x") coupling nodes 102 to network device 110. In practice, there may be more, different, or fewer devices or a different arrangement of devices than what is shown in FIG. 1. For example, environment 100 may include thousands or even millions of nodes and/or network devices. Further, while FIG. 1 shows nodes 102 and network device 110 in environment 100, one or more of these devices may be remotely located from each other, e.g., the devices may be geographically diverse. Although arrows in FIG. 1 may indicate communication directly between devices, it should be understood that communication may be indirect through one or more networks or network devices.

Network device 110 may communicate with nodes 102-1 through 102-4 over links 112-1 through 112-4, respectively. Network device 110 may receive data from one node and may forward the data to one or more other nodes. For example, network device 110 may receive a packet from node 102-1 and may forward the packet to node 102-2. For a multicast, network device 110 may receive a packet from node 102-1 and may forward the packet to nodes 102-2, 102-3, and 102-4. Network device 110 may be a router, a switch, a packet forwarding engine, a firewall, or any other network device capable of receiving and forwarding packets. Network device 110 may also be considered a "node." Communication among user device 110 and nodes 102 may be accomplished via wired and/or wireless communication connections.

Nodes 102 may include computers, telephones, personal digital assistants, or any other communication devices that may transmit or receive data. Nodes 102 may include, for example, computers that exchange data through network device 110. Nodes 102 may also include, for example, telephones that exchange voice conversations through network device 110.

Network Device

Figure 2:
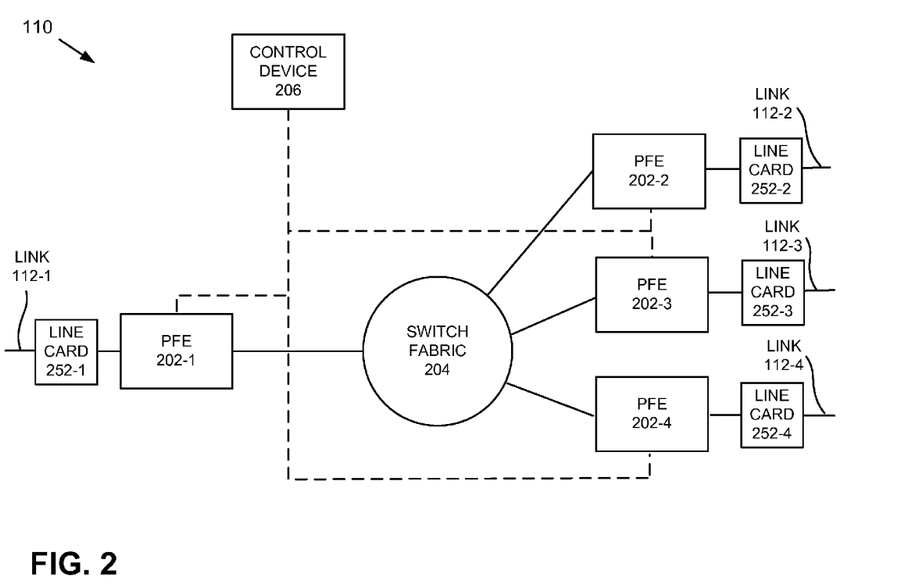
FIG. 2 is a block diagram of exemplary components of a network device of FIG. 1.

FIG. 2 is a block diagram of exemplary components of network device 110. Network device 110 may include packet forwarding engines 202-1 through 202-4 (collectively "PFEs 202," individually "PFE 202-x"), line cards 252-1 through 252-4 (collectively "line cards 252," individually "line card 252-x"), a switch fabric 204, and a control device 206. Network device 110 may include other or different components (not shown) that aid in receiving, transmitting, and/or processing data. For example, there may be more than or less than four PFEs 202 and/or more or less than four line cards 252. Moreover, other configurations of components in network device 110 are possible. Although components of network device 110 are shown together, one or more components of network device may be remotely located from each other.

Control device 206 may perform high level management functions for network device 110. For example, control device 206 may communicate with other network devices (not shown) coupled to network device 110 to exchange information regarding network topology. Control device 206 may create routing tables based on network topology information, create forwarding tables based on the routing tables, and forward the forwarding tables to PFEs 202. Control device 206 may also perform other general control and monitoring functions for network device 110.

Line cards 252 may process incoming data units from links 112. A data unit may include all or a portion of a data packet. Line cards 252 may reassemble data units to form packets and may pass the packets to PFEs 202. Data received by line cards 252 from links 112 may be formatted according to one of several protocols, such as the synchronous optical network (SONET) standard, an asynchronous transfer mode (ATM) technology, or the Ethernet standard. Likewise, line cards 252 may be coupled to nodes 102 via many types of transport media, such as optical fiber, coaxial cable, twisted pair, etc. Line cards 252 may receive packets from PFEs 202 for transmission on links 112. Line cards 252 may prepare packets for transmission by, for example, segmenting packets into data units, adding headers, and transmitting the data units on links 112.

PFEs 202 may each connect to switch fabric 204 (as indicated by dashed lines in FIG. 2) and control device 206. PFEs 202 may receive packets from line cards 252. PFE 202-x may perform a route lookup for a packet using a forwarding table to determine destination information. If the destination information indicates that the packet should be sent out on line card 252-x attached to PFE 202-x, PFE 202-x may pass the packet to the attached line card 252-x. If the destination information indicates that the packet should be sent out on line card 252-x not attached to PFE 202-x, then PFE 202-x may transfer the packet to another PFE 202-x through switch fabric 204.

Line Cards

Figure 3:
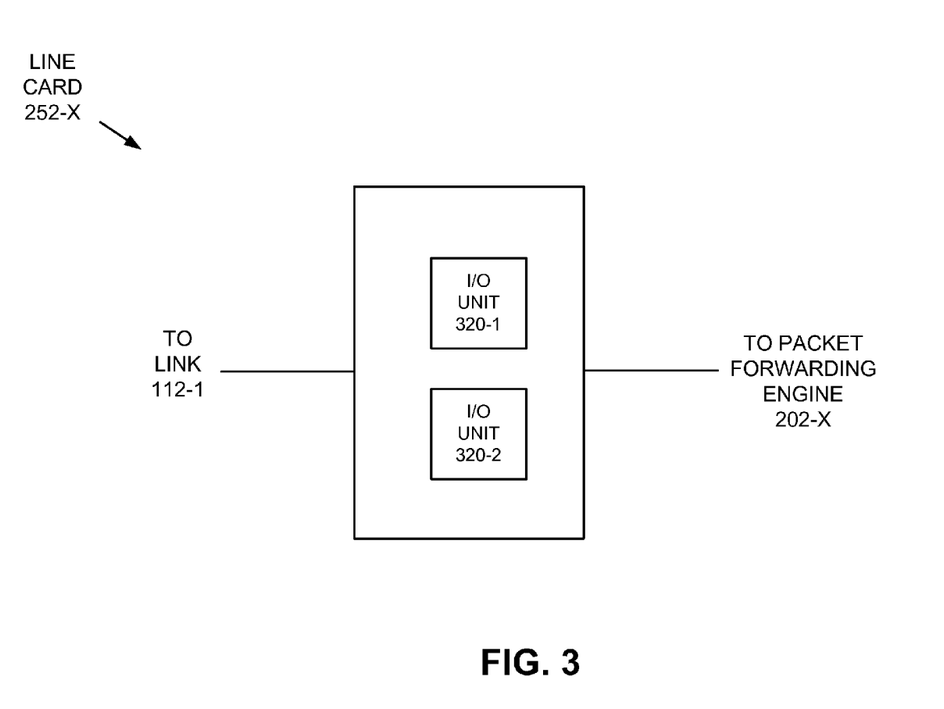
FIG. 3 is a block diagram of exemplary components of a line card of FIG. 2.

FIG. 3 is a block diagram illustrating exemplary components of line card 252-x. Line card 252-x may include a group of input/output (I/O) units 320-1 through 320-2 (collectively "I/O units 320," individually "I/O unit 320-x"). Although FIG. 3 shows two I/O units 320, some embodiments may include one or more than two I/O units 320.

An I/O unit 320-x may operate as an interface between link 112-x and packet forwarding engine 202-x. I/O units 320 may be designed to handle different types of links 112. For example, I/O unit 320-x may interface with an Ethernet link. Alternatively, I/O unit 320-x may interface with an ATM link, a SONET link, etc.

Figure 4:
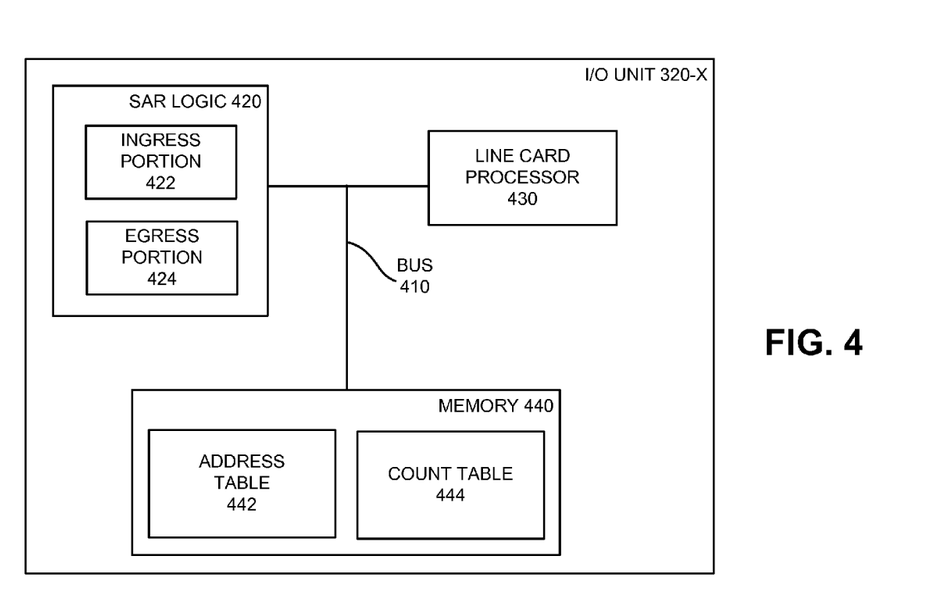
FIG. 4 is a block diagram of exemplary components of an input/output unit of FIG. 3.

FIG. 4 is an exemplary block diagram of exemplary components of I/O unit 320-x in one embodiment. I/O unit 320-x may include a bus 410, segmentation and reassembly (SAR) logic 420, a line card processor 430, and a memory 440. Bus 410 may permit communication among the components of I/O unit 320-x.

SAR logic 420 may segment packets into data units for transmission on links 112 and may reassemble packets from data units received on links 112. SAR logic 420 may include an egress portion 422 and an ingress portion 424. Egress portion 422 may segment packets into data units for transmission. Ingress portion 424 may receive data units for reassembly into packets. SAR logic 420 may include or be coupled to a transceiver-like mechanism (not shown) that enables I/O unit 320-x to communicate with other devices.

Line card processor 430 may include any type of processor or microprocessor that interprets and executes instructions. Line card processor 430 may include an application specific integrated circuit (ASIC), field programmable gate array (FPGA), or the like. Line card processor 430 may process packets prior to transferring the packets to PFE 202-x. Line card processor 430 may also process data units prior to transmission of the data units on link 212-x.

Memory 440 may include a random access memory (RAM) or another type of dynamic storage device that stores information and/or instructions for execution by line card processor. Memory 440 may include synchronous dynamic RAM (SDRAM). Memory 440 may include static RAM (SRAM) and/or dynamic RAM (DRAM). Memory 440 may include a read only memory (ROM) or another type of static storage device that stores static information and instructions for line card processor. Memory 440 may include a CAM or any other type of solid state memory. Memory 440 may include magnetic or optical recording medium and its corresponding drive for storing information and/or instructions. Line card processor 430 may include memory, including a portion of memory 440, such as a DRAM. Memory 440 may include an address table 442 and a count table 444, described in more detail below with respect to FIGS. 5A and 5B.

I/O unit 320-x may perform certain operations, as described in detail below. I/O unit 320-x may perform these operations in response to line card processor 4300 executing software instructions contained in a computer-readable medium, such as memory 440. A computer-readable medium may be defined as a physical or logical memory device and/or carrier wave. The software instructions may be read into memory 440 from another computer-readable medium or from another device. The software instructions contained in memory 440 may cause line card processor 430 to perform processes that are described below.

Address Table

Figure 5A:
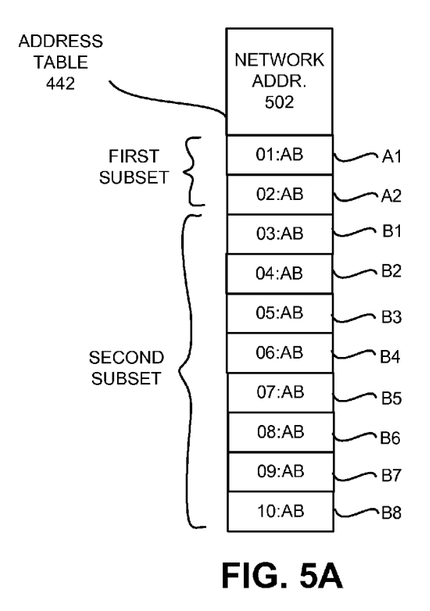
FIGS. 5A and 5B are a diagrams of an exemplary address table and an exemplary count table of FIG. 4, respectively.

FIG. 5A is a block diagram of an exemplary address table 442. Address table 442 may be stored in a memory 440 of I/O unit 320-*x*, for example. In the embodiment described below, address table 442 may be stored in a CAM. It should be noted, however, that address table 442 may be stored in any type of memory consistent with aspects described herein.

Address table 442 may include a network address field 502. Address table 442 may include additional, different, or fewer fields than illustrated in FIG. 5. Address field 502 may identify network addresses of nodes to or from which network device 110 may send or receive data. In exemplary address table 442, address field 502 lists Ethernet media access card (MAC) addresses. In other embodiments, network address field 502 may include addresses for other types of networks, such as an ATM or SONET network.

In one embodiment, exemplary address table 442 may include network addresses 01:AB, 02:AB, 03:AB, 04:AB, 05:AB, 06:AB, 07:AB, 08:AB, 09:AB, and 10:AB, stored in memory addresses A1, A2, B1, B2, B3, B4, B5, B6, B7, and B8, respectively. Although, network addresses 01:AB, 02:AB, etc., may not be valid Ethernet MAC addresses, these addresses may be used for exemplary purposes. Additionally, although memory addresses A1, A2, and B1 through B8 may not be typical memory addresses, they may be used for exemplary purposes as memory addresses in a CAM, for example.

Memory addresses and their corresponding network addresses may be grouped into subsets. As shown in FIG. 5A, a first subset (e.g., group) may include memory addresses A1 and A2. A second subset may include memory addresses B1 through B8. Although address table 442 shows two subsets for exemplary purposes, address table 442 may be grouped into more than two subsets. Further, although address table 442 shows two physically distinct subsets, subsets may be physically intertwined. In other words, subsets need not be contiguous. In addition, subsets may be of an arbitrary size and may be distributed across multiple memories, e.g., multiple CAMs.

Address table 442 may be searched for network addresses. For example, a search of the network address 01:AB may return the address, if any, where that network address is stored, e.g., A1. A search of the network address 02:AB would return the address A2, etc. Address table 442 may be searched for MAC address filtering (permitting or denying certain MAC address), MAC address accounting (counting the quantity of traffic to or from a MAC address), etc. In one embodiment, address table 442 may be searched to convert two VLAN identifiers into an interface ID.

Subsets of address table 442 may be searched. In one embodiment, the first subset may be searched for an address and, if the address is not found in the first subset, the next, e.g., second, subset may be searched. For example, address table 442 may be searched for address 04:AB. In this example, the first subset may be searched and may return no memory address, e.g., address 04:AB may not be found in the first subset. The second subset may be searched, which may result in the memory address B2 being returned because address 04:AB may be stored at memory location B2.

Searching the first subset (e.g., memory address A1 and A2) may require less power than searching the second subset (e.g., memory addresses B1 through B8) because the first subset has fewer memory locations than the second subset. Likewise, searching the first subset for an address may require less power than searching the entire address table 442. Further, searching the second subset for an address may require less power than searching the entire address table 442. In one embodiment, the network addresses more likely to be searched may be stored in the first subset; while network addresses less likely to be searched than those in the first subset may be stored in the second subset. When searching address table 442 for an address, it may only be necessary to search the first subset. If a match is not found in the first subset, then the second subset may be searched. Because the network addresses that are searched for the most often are in the first subset, total power consumption may be reduced as compared to searching the entire memory. In one embodiment, the average power consumed over time may be reduced. In one embodiment, the average amount of time to find a matching entry in the CAM may be increased since a search has to be performed more than once.

Count Table

Figure 5B:
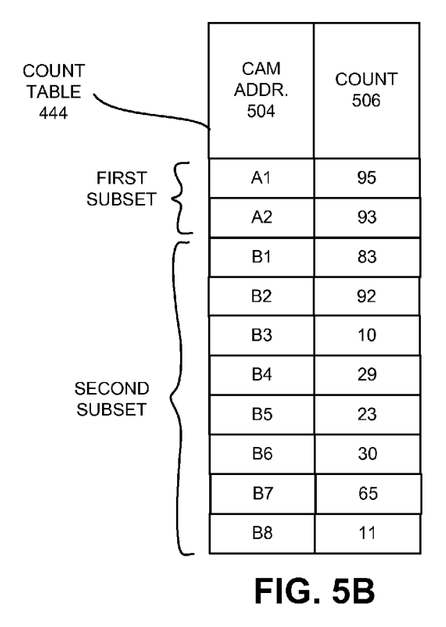

FIG. 5B is a block diagram of an exemplary count table 444. Count table 444 may be stored in memory 440 of I/O unit 320-*x*, for example. In one embodiment described below, count table 444 may be stored in an SDRAM associated with memory 440. Count table 444 may be stored in an SRAM and/or a DRAM. For example, count table 444 may be stored in a DRAM included in line card processor 430 and stored in an SRAM included in memory 440 on I/O unit 320-*x*. Count table 444 may be stored in any type of memory, however, including the same memory as address table 442.

Count table 444 may include a CAM address field 504 and a count field 506. CAM address field 504 may identify a memory address in address table 502. Count field 506 may include a count of the number of packets or data units passed to or from the MAC address stored in the memory address identified in the corresponding CAM address field 504. For example, the MAC address 01:AB (stored in address table 442 at memory address A1) has had 95 packets sent to or from that address. That is, the network address stored at CAM address A1 has a count value of 95. Count table 444 may include additional, different, or fewer fields than illustrated in FIG. 5.

As shown in the exemplary count table 444, the network address stored at CAM address A2 has a count value of 93; the network address stored at CAM address B1 has a count value of 83; the network address stored at CAM address B2 has a count value of 92; the network address stored at CAM address B3 has a count value of 10; the network address stored at CAM address B4 has a count value of 29; the network address stored at CAM address B5 has a count value of 23; the network address stored at CAM address B6 has a count value of 30; the network address stored at CAM address B7 has a count value of 65; and the network address stored at CAM address B8 has a count value of 11.

When a packet is sent to or received from a network address in network address field 502, the corresponding counter in count table 444 may be incremented. For example, if a packet (or other data unit) is received for the address 04:AB (the network address stored at memory address B2), the corresponding count may be incremented from 92 to 93. If another packet is received for the network address 04:AB, the corresponding count may be incremented again from 93 to 94.

In one embodiment, address table 442 may store the most frequently searched network addresses in a subset of address table 442. For example, network addresses 01:AB and 02:AB may be the most frequently searched network addresses and, as a result, may be stored in the first subset with memory addresses A1 and A2. In one embodiment, subsets may be dynamically generated or modified in response to the values maintained in count field 506.

Exemplary Processing

Figure 6:
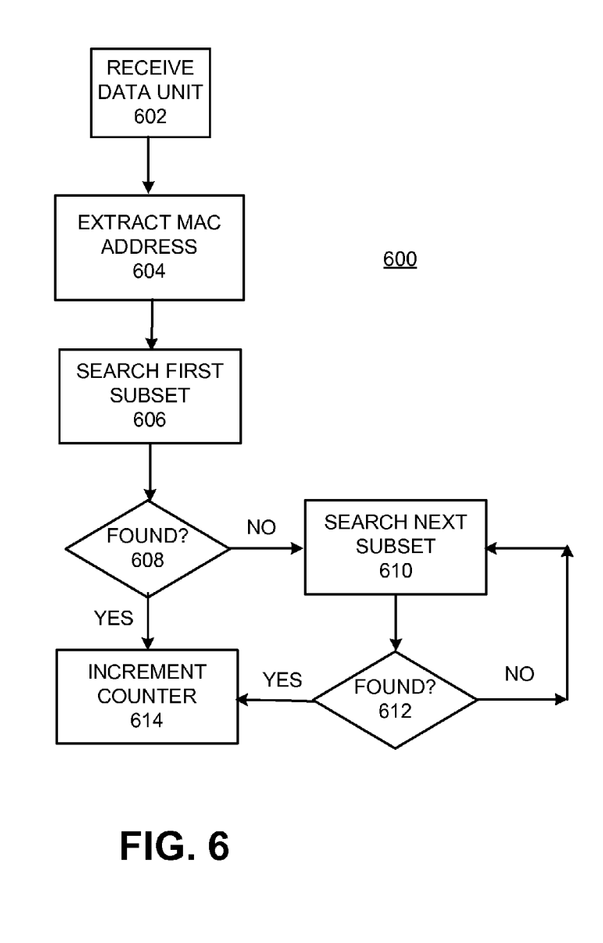
FIG. 6 is a flowchart of an exemplary process for analyzing network traffic.

FIG. 6 is a flowchart of a process 600 for analyzing network traffic. Process 600 is described below with respect to address table 442 and count table 444. In one embodiment, process 600 may be performed by line card processor 430.

Process 600 may begin when a data unit is received (block 602). A data unit may be a frame, a cell, a packet, etc. A data unit may be received in network device 110, for example, in either egress portion 422 or ingress portion 424. A network address, e.g., MAC address, may be extracted from the data unit (block 604). The extracted address may be a source network address or a destination network address. In one example, network device 110 may be configured to monitor the quantity of data being passed to a node 102-$x$ in a network. In this example, a destination address may be extracted in ingress portion 424. If network device 110 is configured to monitor the quantity of data being passed from a node 102-$x$ from a network, a source address may be extracted in egress portion 422.

The first subset of network address table 442, such as the subset with CAM memory addresses A1 and A2, may be searched for the extracted network address (block 606). In one embodiment, the first subset may be the subset determined to have the highest probability of finding a match. If the extracted network address is found in the first subset (block 608: YES), the value in count table 444 corresponding to the extracted network address may be incremented (block 614). In other words, the value in count table 444 corresponding to the CAM memory address storing the extracted network address may be incremented. If the extracted network address is not found in the first subset (block 608: NO), then the next subset of address table 442, e.g., the second subset including addresses B1 through B8, may be searched for the extracted network address (block 610). The next subset may be the subset with the next highest probability of finding a match. If the extracted network address is not found, then process 600 may return to block 610 and the next subset of address table 442 may be searched. Although exemplary network address table 442 only includes two subsets, other embodiments may include more than two subsets. If the extracted network address is found (block 612: YES), the value in count table 444 corresponding to the extracted network address may be incremented (block 614). The data unit may be forwarded to its destination based, for example, on a result of the search in block 606.

Figure 7A:
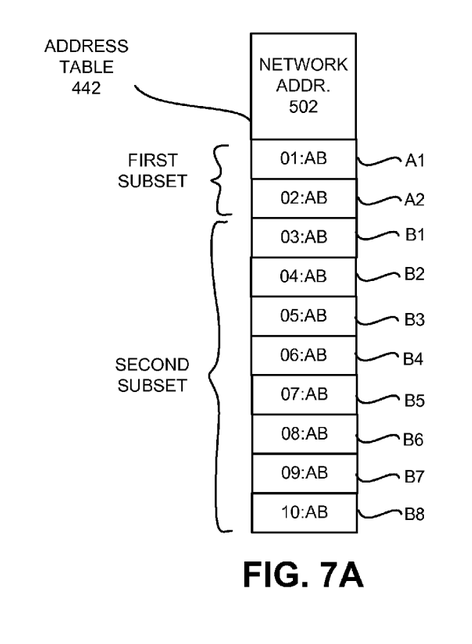
FIGS. 7A and 7B are diagrams of an exemplary address table and an exemplary count table, respectively.
Figure 7B:
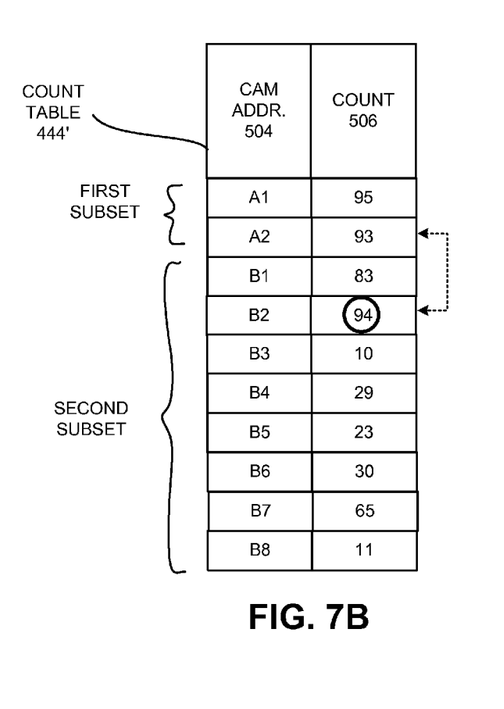

An example of process 600 is described below with respect to FIGS. 5A, 5B, 7A and 7B. FIG. 7A is a diagram of an exemplary address table 442 and FIG. 7B is a diagram of an exemplary count table 444. In this example, network device 110 may receive two (2) data units destined for a node with a network address of 04:AB. As shown in FIGS. 5A and 7A, the network address of 04:AB may be stored in address table 442 at memory address B2. As described in more detail below, the value in count field 506 of count table 444 corresponding to memory address B2 may, therefore, be incremented by two (2) as shown in FIG. 7B ("94") as compared to the value FIG. 5B ("92").

More specifically, the first data unit in this example may enter ingress portion 424. The destination network address (04:AB) may be extracted. The first subset of address table 442 may be searched for the extracted network address (04: AB). In this example, the extracted address may not be found in the first subset of address table 442. The second subset of address table 442 may be searched for the extracted network address (04:AB). In this example, the extracted address may be found at CAM memory address B2. The value in count table 444 corresponding to CAM memory address B2 may be incremented by one. In this case, "92" appearing in count table 444 corresponding to CAM address may be increased to "93" (not shown).

The second data unit with address 04:AB may enter ingress portion 424. The destination network address (04:AB) may be extracted. The first subset of address table 442 may be searched for the extracted network address (04:AB). In this example, the extracted address may not be found in the first subset of address table 442. The second subset of address table 442 may be searched for the extracted network address (04:AB). In this example, the extracted address may be found at CAM address B2. The value in count table 444 corresponding to CAM memory address B2 may be incremented. In this case, "93" (incremented when the first data unit was received) in count table 444 corresponding to CAM address may be increased to "94" as shown circled in FIG. 7B.

Figure 8:
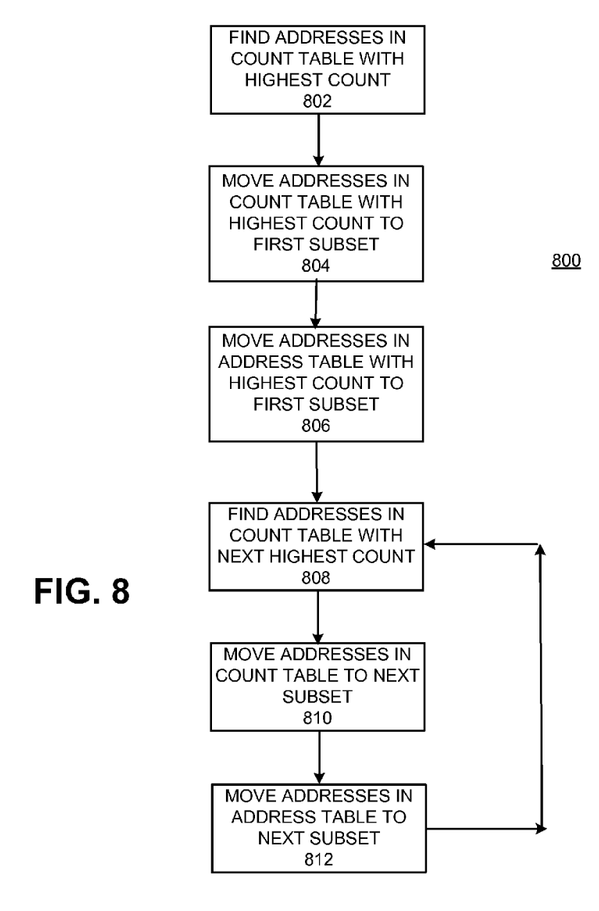
FIG. 8 is a flowchart of an exemplary process for organizing an address table.
Figure 9A:
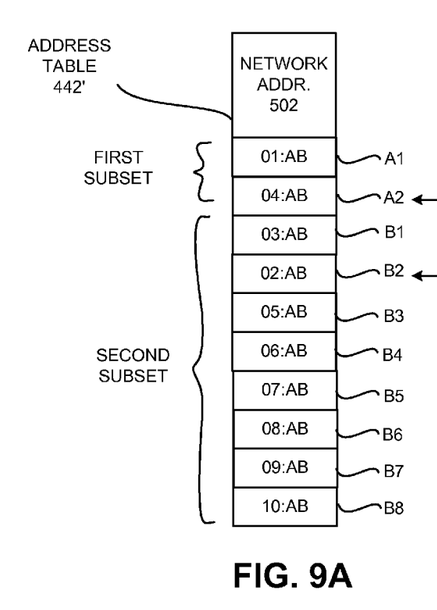
FIGS. 9A and 9B are diagrams of an exemplary address table and an exemplary count table, respectively.
Figure 9B:
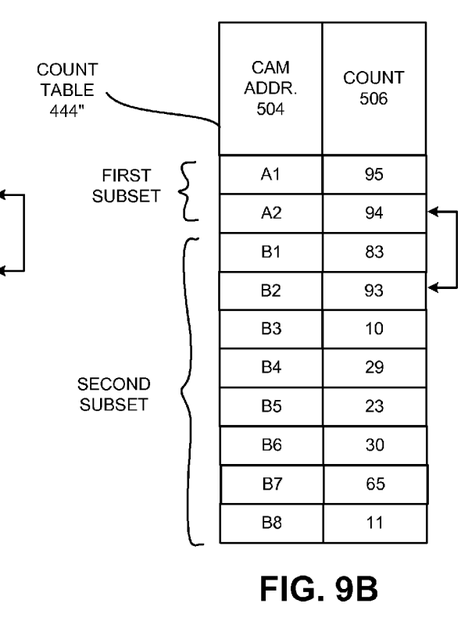

FIG. 8 is a flow diagram of an exemplary process 800 for determining the network addresses in address table 442 most likely to be searched. Process 800 may execute a periodic basis, such as every second, every minute, every hour, etc. Process 800 is described below with respect to FIGS. 7A, 7B, 9A, and 9B. FIG. 7A is a diagram of an exemplary address table 442 and FIG. 7B is a diagram of an exemplary count table 444, both before execution of exemplary process 800. FIG. 9A is a diagram of an exemplary address table 442 and FIG. 9B is a diagram of an exemplary count table 444, both after execution of exemplary process 800.

The CAM memory addresses in count table 444 with the highest count may be found (block 802). In one embodiment, if the first subset includes two addresses, e.g., network or CAM addresses, then the two highest count values may be determined. For example, as shown in FIG. 7B, the two highest count values are 94 and 95 corresponding to CAM address B2 and A2, respectively. CAM addresses B2 and A2 correspond to MAC addresses 04:AB and 01:AB, respectively.

The network addresses, e.g., MAC address, in address table 442 corresponding to the highest count values may be moved to the first subset (block 804), if necessary. For example, referring to FIG. 7A and FIG. 9A, network address 04:AB may be moved to CAM address A2 in the first subset from the second subset address B2. MAC address 02:AB may be moved from CAM address A2 in the first subset to CAM address B2 in the second subset to make room for network address 04:AB. Network address 01:AB already may be in the first subset and, therefore, may not have to be moved to the first subset. In one embodiment, subset designations may be switched rather than moving memory content.

The count values in count table 444 may also be moved with respect to the corresponding network address in address table 442 (block 806). For example, referring to FIGS. 7 and 8, the count value of 94 is moved to correspond to CAM address A2 and the count value of 93 is moved to correspond to CAM address B2.

Because the example in FIGS. 7A, 7B, 9A, and 9B has two subsets, process 800 may stop. In embodiments with more than two subsets, however, process 800 may continue. The address in count table with the next highest count may be found (block 808). In one embodiment, if the next subset includes eight addresses, then the eight next highest count values may be determined. The address in address table 442 with the next highest count may be moved to the next subset (block 810). The addresses in count table 444 corresponding to the address in address table 442 may be moved accordingly (block 812).

Process 800 may be considered a sorting algorithm. Other types of sorting algorithms may be used where the most frequent addresses are stored in the first subset, the second most frequent addresses are stored in the second subset, the third most frequent addresses are stored in the third subset, etc. Process 800 may be a sorting algorithm performed by a processor, such as line card processor 430, executing software instructions. The processor may store count table 444 in a memory included within the processor, such as a DRAM. Count table 444 may also be stored in a memory, such as a DRAM, external to the processor. The processor may copy the contents of count table 444 stored internally to or from the count table 444 stored externally as necessary.

Other processes may determine the network addresses in address table 442 most likely to be searched. For example, data units may be inspected for protocol type. A weighted average of the counter value may be used to determine the network addresses in address table 442 most likely to be searched. In another implementation consistent with aspects described herein, past history of traffic may be used to determine the network addresses in address table 442 most likely to be searched. In one embodiment, a time-dependant function of past history of count values may be may be used to determine the network addresses in address table 442 most likely to be searched. For example, past count values may "decay" with time so older count values are not as important as newer count values. For instance, a new count value may equal 0.9*a past count value plus a current count value. In addition, the user configuration may be used to determine the network addresses in address table 442 most likely to be searched. For example, a network address configured to benefit from a higher bandwidth (as purchased by a customer) may be more likely to be searched.

In the above example, if 90% of the searches are satisfied by searching the first subset and 10% of the searches are satisfied by searching the second subset, power consumption may be reduced by 72% because, on average, only 2.8 CAM entries would have to be searched (0.9*2+0.1*10) as opposed to searching all 10. Because two searches may be performed, the total search time may increase by 10% ((0.9*1+0.1*2−1=0.1).

Although embodiments described above include network device 110, other embodiments may include a CAM in a device other than network devices. In addition, although embodiments described above may include a CAM, other embodiments may include memory devices other than CAMs.

CONCLUSION

Implementations described herein may allow a network device to conserve power, e.g., the amount of work done or energy transferred per unit of time. By grouping entries in a CAM, the average power consumed by the CAM over a period of time may be reduced.

The descriptions of exemplary components above include a discussion of software instructions contained in computer-readable media. Alternatively, in each of these implementations, hardwired circuitry may be used in place of or in combination with software instructions to implement processes described herein. Thus, implementations described herein are not limited to any specific combination of hardware circuitry and software.

It will also be apparent that aspects, as described above, may be implemented in many different forms of software, firmware, and hardware in the implementations illustrated in the figures. The actual software code or specialized control hardware used to implement these aspects is not limiting of the present invention. Thus, the operation and behavior of the aspects were described without reference to the specific software code—it being understood that software or control hardware could be designed to implement the aspects based on the description herein.

Further, although the processes described above, including process 600 and 800, may indicate a certain order of blocks, the blocks in these figures may be configured in any order.

In addition, implementations described herein may use the internet-protocol (IP), asynchronous transfer mode (ATM) protocol, or any other type of network protocol. As such, implementations described herein may use IP addresses, ATM addresses, or any other type of network addresses. Implementations may be described in terms of packets, implementations could use any form of data (packet or non-packet).

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed:

1. A device comprising:
 a memory that stores data including:
  a plurality of data entries, and
  a plurality of count values, where each of the plurality of count values indicates a number of times that a corresponding one of the plurality of data entries has been previously accessed; and
 a processor to:
  sort the plurality of data entries based on the plurality of count values;
  receive a search request, and
  identify one, of the plurality of data entries that correspond to the search request, where the processor, when identifying the one of the plurality of data entries, is further to:
   search a first group, of the plurality of data entries, for data corresponding to the search request, where the first group includes a particular number of the sorted plurality of data entries that were previously accessed more often, relative to a second group, and
   if the data corresponding to the search request is not located in the first group, search the second group for the data, where the second group includes ones, of the plurality of data entries, that are not included in the first group.

2. The device of claim 1, where the memory includes a content addressable memory (CAM).

3. The device of claim 2, where the processor is further to increment a count value, of the plurality of count values, associated with the identified one of the plurality of data entries.

4. The device of claim 3, where the processor is further to re-sort the plurality of data entries after incrementing the count value.

5. The device of claim 1, where, when sorting the pluralities of data entries, the processor is to:
sort the plurality of data entries based on a time-dependent function of the count values.

6. The device of claim 1, where each of the plurality of data entries corresponds to a network address.

7. The device of claim 6, where the processor is further to determine, according to a network address in the identified one of the data entries, to either forward or drop a data unit from which the search request is extracted.

8. The device of claim 7, where, when sorting the pluralities of data entries, the processor is to
sort the plurality of data entries based on at least one of:
a protocol associated with the data unit, or
a user configuration setting associated with the data unit.

9. A method comprising:
grouping, by a device, network addresses stored in a memory into a plurality of groups based on count values that each indicate a number of times that a corresponding one of the network addresses has been previously accessed;
searching, by the device, a first group, of the plurality of groups for a particular network address, where the first group includes a particular number of the network addresses that includes higher count values, relative to remaining ones of the network addresses in other ones of the plurality of groups, where the particular number corresponds to a number of the network addresses that can be searched concurrently; and
if the particular network address is not found in the first group, searching a next one of the plurality of groups for the particular network address.

10. The method of claim 9, further comprising:
receiving, by the device, a data unit; and
extracting, by the device, the particular network address from the received data unit.

11. The method of claim 10, where grouping the network addresses is further based on at least one of:
a protocol associated with the data unit, or
a user configuration setting associated with the data unit.

12. The method of claim 10, further comprising:
determining whether to forward the data unit or drop the data unit based on searching the first group or searching the next one of the plurality of groups for the particular network address.

13. The method of claim 9, where the memory is a content addressable memory (CAM).

14. The method of claim 9, further including:
incrementing one of the count values that corresponds to the particular network address.

15. The method of claim 9, where grouping the network addresses is further based on a time-dependent function of the count values.

16. A memory device to store instructions executable by a processor in a network device, the instructions comprising:
one or more instructions to sort a plurality of stored data entries based on a plurality of count values, where each of the plurality of count values indicates a number of times that the processor has previously accessed a corresponding one of the plurality of stored data entries;
one or more instructions to extract, from a data unit, a search criteria;
one or more instructions to search, in response to extracting the search criteria, a first group, of the plurality of stored data entries, for data corresponding to the search criteria, where the first group includes a particular number of the plurality of stored data entries that are associated with higher ones of the plurality of count values, relative to a second group of the plurality of stored data entries; and
one or more instructions to search, if the data corresponding to the search criteria is not in the first group, the second group for the data, where the second group includes remaining ones, of the plurality of stored data entries, that are not included in the first group.

17. The memory device of claim 16, where the instructions further include:
one or more instructions to increment a count value, of the plurality of count values, associated with the one, of the plurality of stored data entries, that includes the data corresponding to the search criteria.

18. The memory device of claim 16, where the one or more instructions to sort the plurality of stored data entries includes one or more instructions to sort the plurality of stored data entries based on a time-dependent function of the count values.

19. The memory device of claim 16, where the instructions further include:
one or more instructions to determine, according to the data corresponding to the search criteria, to either forward or drop the data unit.

20. The memory device of claim 16, where the one or more instructions to sort the plurality of stored data entries includes one or more instructions to sort the plurality of stored data entries further based on at least one of:
a protocol associated with the data unit, or
a user configuration setting associated with the data unit.

* * * * *

UNITED STATES PATENT AND TRADEMARK OFFICE
CERTIFICATE OF CORRECTION

| | | |
|---|---|---|
| PATENT NO. | : 7,984,235 B2 | Page 1 of 1 |
| APPLICATION NO. | : 12/697063 | |
| DATED | : July 19, 2011 | |
| INVENTOR(S) | : Harsha Narayan et al. | |

It is certified that error appears in the above-identified patent and that said Letters Patent is hereby corrected as shown below:

Cover page, item (75) Inventors, "Soren B. Pendersen" should read --Soren B. Pedersen--.

Signed and Sealed this
Twenty-third Day of August, 2011

David J. Kappos
*Director of the United States Patent and Trademark Office*